(12) United States Patent
Lai

(10) Patent No.: US 8,342,703 B2
(45) Date of Patent: Jan. 1, 2013

(54) LIGHT EMITTING APPARATUS

(75) Inventor: Kuang-Chu Lai, New Taipei (TW)

(73) Assignee: Liang Meng Plastic Share Co., Ltd., New Taipei (TW)

( * ) Notice: Subject to any disclaimer, the term of this patent is extended or adjusted under 35 U.S.C. 154(b) by 137 days.

(21) Appl. No.: 13/040,964

(22) Filed: Mar. 4, 2011

(65) Prior Publication Data

US 2012/0008304 A1 Jan. 12, 2012

(30) Foreign Application Priority Data

Jul. 6, 2010 (TW) ................................ 99122183 A

(51) Int. Cl.
*F21V 9/16* (2006.01)
(52) U.S. Cl. ................. 362/84; 362/249.02; 362/311.02
(58) Field of Classification Search .................... 362/84, 362/153.1, 249.02, 311.02
See application file for complete search history.

(56) References Cited

U.S. PATENT DOCUMENTS

| 2004/0130019 | A1* | 7/2004 | Chen .............................. 257/723 |
| 2004/0183081 | A1* | 9/2004 | Shishov et al. ................. 257/79 |
| 2007/0279904 | A1 | 12/2007 | Tasch et al. |

FOREIGN PATENT DOCUMENTS

| DE | 2004004778 A1 | 9/2005 |
| JP | 2003110146 A | 4/2003 |
| JP | 2005223216 A | 8/2005 |

OTHER PUBLICATIONS

Search Report.

* cited by examiner

*Primary Examiner* — David V Bruce
(74) *Attorney, Agent, or Firm* — Chun-Ming Shih; HDLS IPR Services

(57) ABSTRACT

A light emitting apparatus including a circuit board (10), at least one light emitting chip (20), an integrated optical cover (30) and a fluorescent layer (40). The light emitting chip (20) is arranged on the circuit board (10). The integrated optical cover (30) has a peripheral wall (31), a top wall (32) and a light guiding post (33). The peripheral wall (31) is arranged around the circuit board (10). The top wall (32) is arranged on the peripheral wall (31). The light guiding post (33) extends from the top wall (32) toward the light emitting chip (20). The light guiding post (33) includes a recess portion (332). The light emitting chip (20) is accommodated in the recess portion (332). The fluorescent layer (40) is arranged between the recess portion (332) and the light emitting chip (20). By using the recess portion (332) and the light emitting chip (20) cooperatively to confine the fluorescent layer (40), the thickness thereof can be controlled to be consistent.

13 Claims, 3 Drawing Sheets

US 8,342,703 B2

LIGHT EMITTING APPARATUS

BACKGROUND OF THE INVENTION

1. Field of the Invention

The present invention relates to an illumination apparatus, particularly relates to an illumination apparatus adopted light emitting diodes as light sources.

2. Description of Related Art

Light emitting diodes have advantages of saving electrical power, which makes them possible to replace traditional light bulb and to be used as next generation light sources.

White light emitting devices, which are most popularly used in the field of general lighting, need to be packaged before they are applied into practical use. They usually have some packaging processes described hereinafter. At first, a light emitting chip is disposed on a substrate, and a florescent layer for converting light wavelength is formed on the light emitting chip. Then, liquid encapsulating material is further formed on the florescent layer and the light emitting chip. Then, a curing treatment is performed to cure the liquid encapsulating material so as to seal the fluorescent layer and the light emitting chip. Besides, a lens with specific curvature can be formed on the encapsulating material to control the divergent angle of the light emitted from the light emitting chip.

Conventional fluorescent layer is made by dispensing or coating a liquid layer on the top face and peripheral face of the light emitting chip and then curing the liquid layer. However, the surface of the liquid fluorescent layer is affected by the surface tension and is usually of spherical shaped. Therefore, consistent thickness is hard to obtain on both the top face and peripheral face of the light emitting chip. Consequently, white light emitted from the light emitting diodes can not be uniform in all directions.

In another aspect, since each individual packaged light emitting device can only provide a small amount of light intensity, a plurality of packaged light emitting devices have to be arranged together on a circuit board to get enough light intensity for practical use. For aesthetic purpose, an additional transparent cover is provided on the circuit board to cover the circuit traces and the electronic elements on the circuit board. However, transparent cover will partially absorb or reflect the light emitted from the packaged light emitting devices. That leads to decreasing the amount of light available for use. Besides, the transparent cover also increases the manufacturing cost.

SUMMARY OF THE INVENTION

The objective of the present invention is to provide a LED street lamp having corresponding heat dissipating holes on both the top and bottom shell so as to allow heated air in the lamp housing to naturally flow upwardly and effectively increase the speed of airflow to dissipate operating heat generated from the LEDs.

Accordingly, the present invention provides a light emitting apparatus including a circuit board, at least one light emitting chip, an integrated optical cover and a fluorescent layer. The light emitting chip is arranged on the circuit board. The integrated optical cover has a peripheral wall, a top wall and a light guiding post. The peripheral wall is arranged around the outer edge of the circuit board. The top wall is arranged on the upper edge of the peripheral wall. The light guiding post extends from the top wall toward the light emitting chip. The light guiding post includes an end face having a recess portion. The outer edge of the end face is against the circuit board. The light emitting chip is accommodated in the recess portion. The fluorescent layer is arranged between the recess portion and light emitting chip.

This invention uses the recess portion of the light guiding posts and the light emitting chip cooperatively to confine the shape of the fluorescent layer, so the thickness of the fluorescent layer can be controlled to be consistent on both the top face and the peripheral face of the light emitting chip and the white light distribution can be uniform. Also, the one-piece formed integrated optical cover is able not only to package the circuit board by the peripheral wall and the top wall, but also to package the light emitting chip by corresponding light guiding post. No additional transparent cover as conventional is needed, and the structure of the light emitting apparatus can be simplified.

DETAILED DESCRIPTION OF THE INVENTION

The technical characteristics and contents of the present invention will become apparent with the following detailed description accompanied with related drawings.

Figure 1:
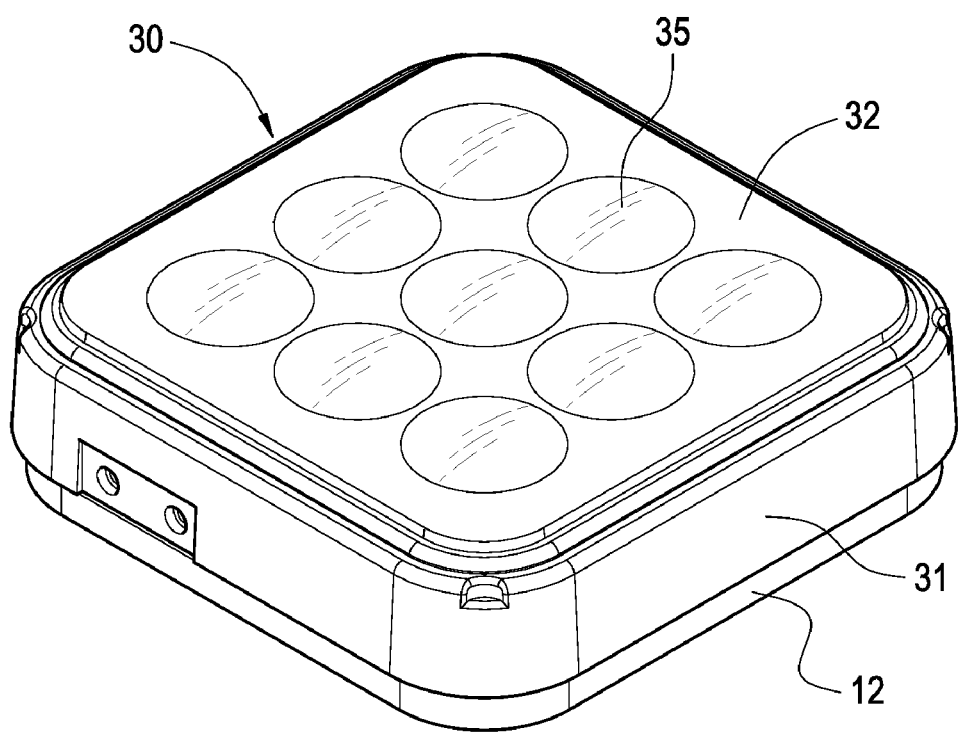
FIG. 1 is a perspective view of the light emitting apparatus of the present invention.
Figure 2:
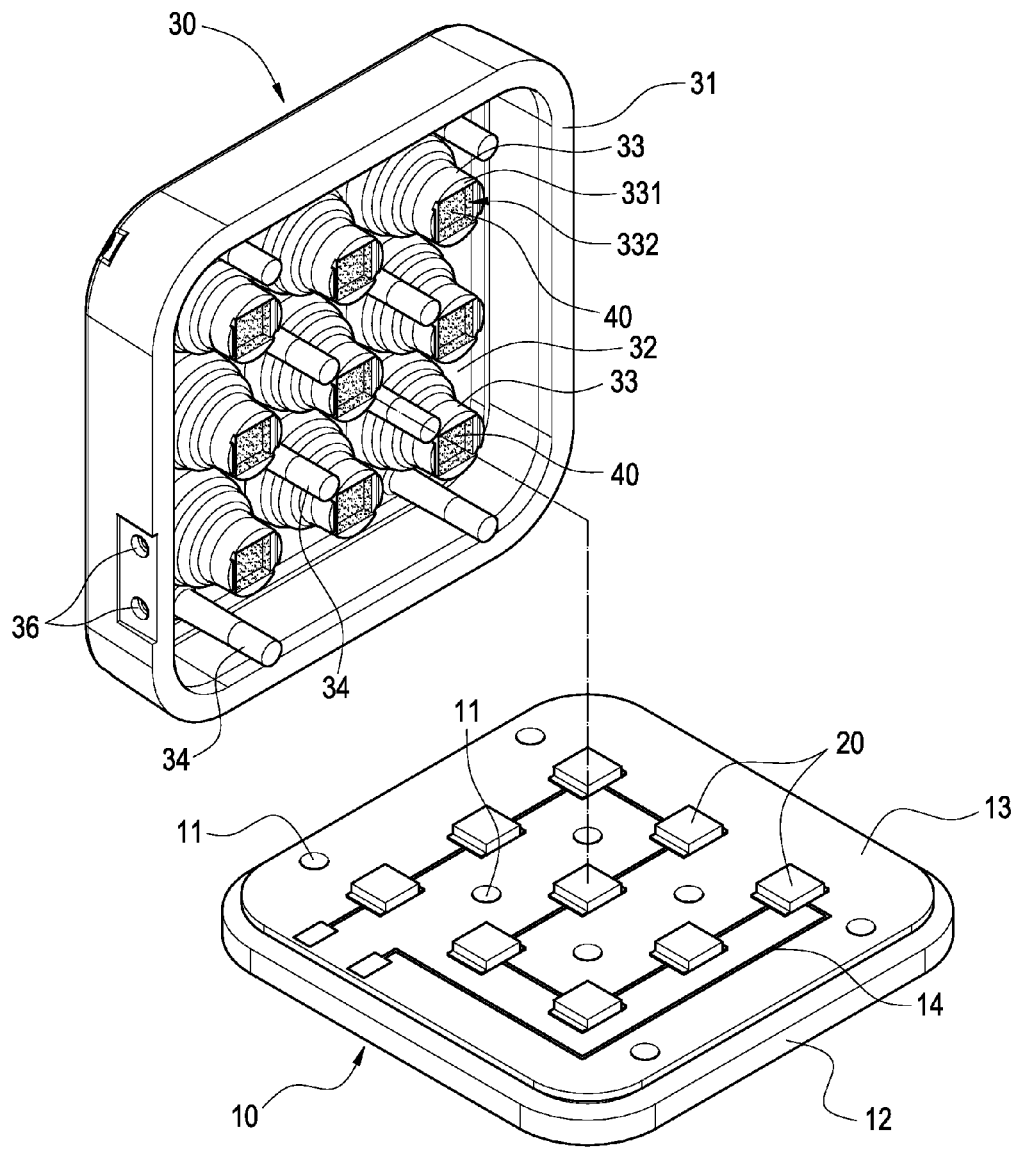
FIG. 2 is a partial exploded view of the light emitting apparatus of the present invention.

FIG. 1 and FIG. 2 show a light emitting apparatus according to an embodiment of the present invention. The light emitting apparatus mainly includes a circuit board 10, a plurality of the light emitting chips 20, an integrated optical cover 30, and a plurality of fluorescent layer 40.

The circuit board 10 is substantially of rectangular-shape and has a plurality of positioning holes 11 thereon. The circuit board 10 has a metal base plate 12 for dissipating heat generated from the light emitting chip 20, an insulating layer 13 disposed on the metal base plate 12, and a circuit pattern 14 on the insulating layer 13. The number of the positioning holes 11 is not limited to the number shown in the figure and can be at least one in practical use.

The light emitting chips 20 are arranged on the circuit board 10 in intervals and electrically connected to the circuit pattern 14. In this embodiment, the manner that the circuit pattern 14 electrically connects the light emitting chips 20 is, but not limited thereto, in serial relation. Besides, the number of the light emitting chips is not limited to the number shown in the figure, and can be at least one.

Figure 3:
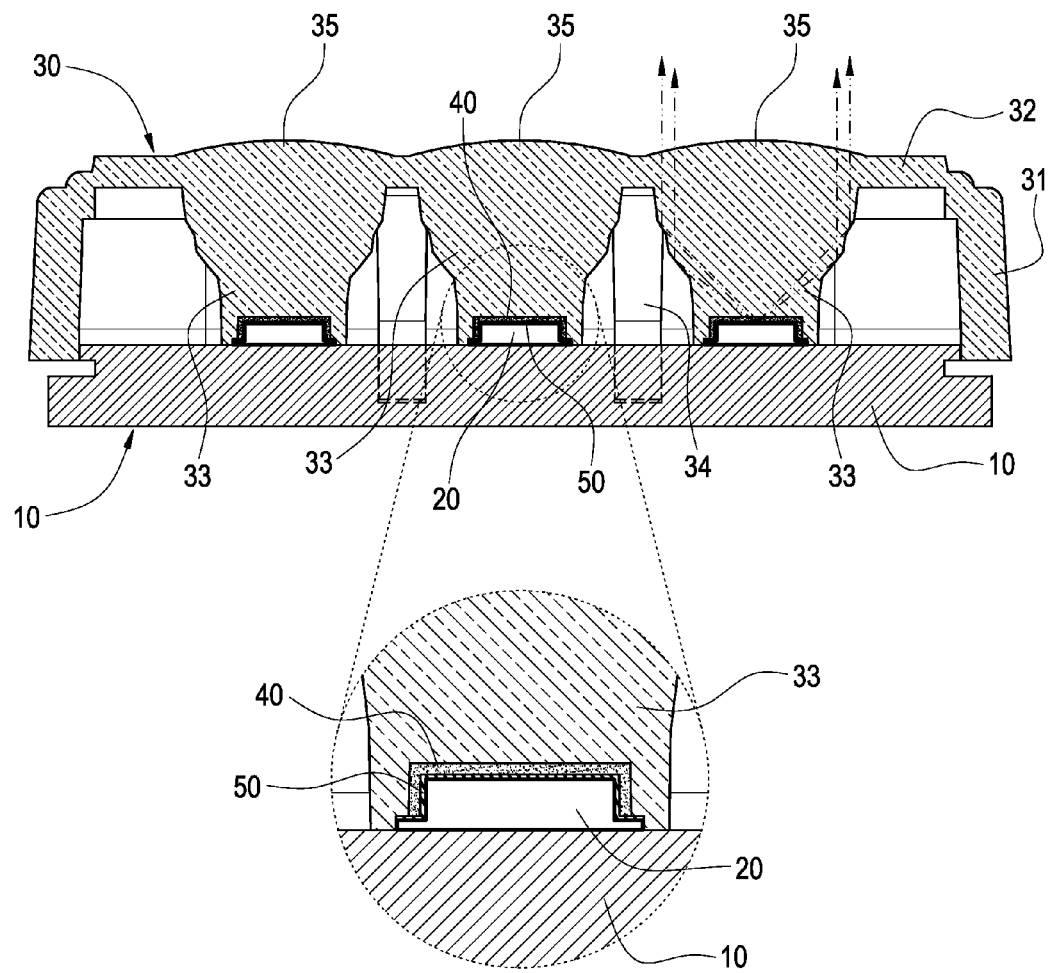
FIG. 3 is cross-sectional view of the light emitting apparatus of the present invention.

As FIG. 2 and FIG. 3 show, the integrated optical cover 30 has a peripheral wall 31 arranged around the outer edge of the circuit board 10, a top wall 32 arranged on the upper edge of the peripheral wall 31, a light guiding post 33 downwardly extending from the top wall 32 and toward the light emitting chips 20, and a positioning post 34 extending from the top wall 32 and tightly inserted into the positioning hole 11.

Each of the light guiding posts 33 has an end face 331 having a recess portion 332. The outer edge of the end face 331 is against the circuit board 10. The light emitting chip 20 are accommodated in the recess portions 332. It should be noted that, the diameter of each of the light guiding posts 33 decreases from the top wall 32 to the end face 331, so as to converge light beams emitted from the light emitting chips 20 toward the optical axis of the light guiding posts 33 and to increase the light output efficiency. The number of the light guiding posts 33 should be consistent with the number of the light emitting chips 20.

Besides, a convex portion 35 for converging light is formed on the top wall 32 and located at the opposite side of the light guiding post 32. Also, at least one plug hole 36 can be formed on the integrated optical cover 30 for electrically connecting the circuit board 10 with external electrical power (not shown).

In addition, the peripheral wall 31, the top wall 32, the light guiding posts 33, the convex portion 35 and the positioning post 34 of the integrated optical cover 30 are one-piece formed by plastic molding. Thus, the number of the components of the light apparatus of the present invention can be decreased, and the manufacturing cost and assembling time can also be reduced.

The fluorescent layers 40 can be used to convert the wavelength of a part of light emitted from the light emitting chips 20 and to form white light. Each of the fluorescent layers 40 is arranged between the recess portion 332 and light emitting chip 20. Besides, an adhesive silicone layer 50 is arranged between each of the fluorescent layers 40 and each of the light emitting chips 20.

Accordingly, since the shape of the fluorescent layer 40 is confined by the recess portion 332 and the light emitting chips 20, the thickness of the fluorescent layer 40 can be consistent on both the top face and the peripheral face of the light emitting chip 20, and the fluorescent layer 40 can be avoided from forming conventional spherical shaped due to surface tension and leading to non-uniform white light distribution in all directions.

By using the recess portion 332 of the light guiding posts 33 and the light emitting chips 20 cooperatively to confine the shape of the fluorescent layers 40, the thickness of the fluorescent layer 40 can be controlled to be consistent on both the top face and the peripheral face of the light emitting chips 20 and uniform white light distribution can be provided.

In another aspect, the one-piece formed integrated optical cover 30 is able not only to package the circuit board 10 by the peripheral wall 31 and the top wall 32 to avoid exposing the circuit and electrical components thereon, but also to package each of the light emitting chips 20 by corresponding light guiding post 33. Since there is no additional transparent cover as conventional, the structure of the light emitting apparatus can be simplified, the amount of light available for use can increase and the manufacturing cost can also be reduced.

What is claimed is:
1. A light emitting apparatus, comprising:
a circuit board 10;
at least one light emitting chip (20) arranged on the circuit board (10);
an integrated optical cover (30) having a peripheral wall (31) arranged around the outer edge of the circuit board (10), a top wall (32) arranged on the upper edge of the peripheral wall (31), and a light guiding post (33) extending from the top wall (32) and toward the light emitting chip (20), wherein the light guiding post (33) comprises an end face (331) having a recess portion (332) and the outer edge of the end face (331) is against the circuit board (10) and the light emitting chip (20) is accommodated in the recess portion (332); and
a fluorescent layer (40) arranged between the recess portion (332) and the light emitting chip (20),
wherein at least one plug hole (36) is formed on the integrated optical cover (30) for electrically connecting the circuit board (10) with external electrical power.

2. The light emitting apparatus of claim 1, wherein the diameter of the light guiding post (33) decreases from the top wall (32) to the end face (331).

3. The light emitting apparatus of claim 1, further comprising an adhesive layer (50) arranged between the fluorescent layer (40) and the light emitting chip (20).

4. The light emitting apparatus of claim 1, wherein the circuit board (10) has a metal base plate (12), an insulating layer (13) disposed on the metal base plate (12), and a circuit pattern (14) on the insulating layer (13).

5. The light emitting apparatus of claim 1, wherein a convex portion for converging light is formed on the top wall and located at the opposite side of the light guiding post.

6. The light emitting apparatus of claim 5, wherein the circuit board (10) has at least one positioning hole (11) and the integrated optical cover (30) has a positioning post (34) extending from the top wall (32) and tightly inserted into the positioning hole (11).

7. The light emitting apparatus of claim 6, wherein the peripheral wall (31), the top wall (32), the light guiding post (33), the convex portion (35) and the positioning post (34) of the integrated optical cover (30) are one-piece formed.

8. A light emitting apparatus, comprising:
a circuit board 10;
at least one light emitting chip (20) arranged on the circuit board (10);
an integrated optical cover (30) having a peripheral wall (31) arranged around the outer edge of the circuit board (10), a top wall (32) arranged on the upper edge of the peripheral wall (31), and a light guiding post (33) extending from the top wall (32) and toward the light emitting chip (20), wherein the light guiding post (33) comprises an end face (331) having a recess portion (332) and the outer edge of the end face (331) is against the circuit board (10) and the light emitting chip (20) is accommodated in the recess portion (332); and
a fluorescent layer (40) arranged between the recess portion (332) and the light emitting chip (20),
wherein the circuit board (10) has a metal base plate (12), an insulating layer (13) disposed on the metal base plate (12), and a circuit pattern (14) on the insulating layer (13).

9. The light emitting apparatus of claim 1, wherein the diameter of the light guiding post (33) decreases from the top wall (32) to the end face (331).

10. The light emitting apparatus of claim 1, further comprising an adhesive layer (50) arranged between the fluorescent layer (40) and the light emitting chip (20).

11. The light emitting apparatus of claim 1, wherein a convex portion for converging light is formed on the top wall and located at the opposite side of the light guiding post.

12. The light emitting apparatus of claim 5, wherein the circuit board (10) has at least one positioning hole (11) and the integrated optical cover (30) has a positioning post (34) extending from the top wall (32) and tightly inserted into the positioning hole (11).

13. The light emitting apparatus of claim 6, wherein the peripheral wall (31), the top wall (32), the light guiding post (33), the convex portion (35) and the positioning post (34) of the integrated optical cover (30) are one-piece formed.

* * * * *